(12) United States Patent
Wang et al.

(10) Patent No.: US 7,526,703 B2
(45) Date of Patent: Apr. 28, 2009

(54) METHOD OF TEST PATTERN GENERATION IN IC DESIGN SIMULATION SYSTEM

(75) Inventors: Min-Shu Wang, Taipei (TW);
Chun-You Wang, Taipei (TW);
Chun-Chih Yang, Taipei (TW)

(73) Assignee: Via Technologies, Inc., Taipei (TW)

( * ) Notice: Subject to any disclaimer, the term of this patent is extended or adjusted under 35 U.S.C. 154(b) by 379 days.

(21) Appl. No.: 11/456,590

(22) Filed: Jul. 11, 2006

(65) Prior Publication Data
US 2007/0101226 A1 May 3, 2007

(30) Foreign Application Priority Data
Oct. 13, 2005 (TW) .............................. 94135676 A

(51) Int. Cl.
*G01R 31/28* (2006.01)
(52) U.S. Cl. ................. 714/741; 714/738; 714/739
(58) Field of Classification Search ............ 714/738, 714/739, 741
See application file for complete search history.

(56) References Cited

U.S. PATENT DOCUMENTS 5,534,930 A * 7/1996 Jung ................. 375/240.03
5,535,223 A * 7/1996 Horstmann et al. ......... 714/744
5,987,636 A   11/1999 Bommu et al.
6,751,768 B2 * 6/2004 Muradali et al. ............ 714/738
6,862,717 B2 * 3/2005 Nadeau-Dostie et al. ....... 716/4
7,408,362 B2 * 8/2008 Ahmad et al. ............... 324/527

OTHER PUBLICATIONS

Pomeranz et al, "Static Compaction for Two-Pattern Test Sets", The Fourth Asian Test Symposium, IEEE 1995, pp. 222-228.*
El-Maleh et al., "Test Vector Decomposition-Based Static Compaction Algorithms for Combinational Circuits", ACM Transactions on Design Automation of Electronic Systems, vol. 8, No. 4, Oct. 2003, pp. 430-459.*
TW office action mailed Jun. 8, 2007.

* cited by examiner

*Primary Examiner*—Cynthia Britt
*Assistant Examiner*—John J Tabone, Jr.
(74) *Attorney, Agent, or Firm*—Thomas, Kayden, Horstemeyer & Risley

(57) ABSTRACT

The invention provides a method of test pattern generation for an integrated circuit (IC) design simulation system, comprising merging at least 2 test vectors into a merged vector, wherein each test defines a set of test behaviors, and compiling and linking the merged vector using the IC design simulation system to generate a merged test pattern able to perform each set of test behaviors independently.

12 Claims, 3 Drawing Sheets

| 1 | 2 | 3 | M |
|---|---|---|---|
| 11 Test configuration | 21 Test configuration | 31 Test configuration | ... M1 Test configuration |
| 12 Test behavior | 22 Test behavior | 32 Test behavior | M2 Test behavior |

FIG. 2A

| A0 | | | | |
|---|---|---|---|---|
| A01 Common configuration | | | | |
| 12 Test behavior | 22 Test behavior | 32 Test behavior | ... | M2 Test behavior |

FIG. 2B

METHOD OF TEST PATTERN GENERATION IN IC DESIGN SIMULATION SYSTEM

BACKGROUND

The invention is related to an integrated circuit (IC) design simulation and, more particularly, to a method of test pattern generation for an integrated circuit (IC) design simulation system.

Conventionally, when designing an IC, an IC design simulation system can be utilized to test the design. A test vector is composed for each set of test operations to test IC behavior. Each test vector is then compiled and linked for generation of a test pattern. The test pattern is executed to generate simulated results according to the set of test operations. The IC design simulation system comprises a test model for function simulation of the IC, and a plurality of device models for function simulation of the devices the IC are designed to connect thereto. The interactions of the IC and the devices can be simulated to verify the function of the IC.

FIG. 1 is a flowchart of a conventional method for IC design simulation. Test vectors 1~M are composed for different sets of operations, respectively. Each test vector can comprise test configuration and test behavior. The test configuration comprises settings of the test model and device models according to the test behavior.

As shown, test vectors 1~M are composed for different sets of operations. Test vectors 1~M are then compiled and linked to generate test pattern 1~M. Test pattern 1~M is then executed, comprising configuring the test model and device models as defined by test configuration and performing the test operations defined by the test behavior. Corresponding operation record file and error log file will be generated after test pattern 1~M execution. M times of compiling, linking and configuration time will be consumed.

Conventionally, a set of test operations requires compiling and linking time for generate a test pattern from a test vector, and configuration and execution time for performing a simulation. Multiple test operations may required when designing an IC, thus the time consumed on the compiling, linking, configuration and execution is significant.

SUMMARY

The invention provides a method of test pattern generation for an IC design simulation system, comprising merging at least 2 test vectors into a merged vector, wherein each test defines a set of test behaviors, and compiling and linking the merged vector using the IC design simulation system to generate a merged test pattern capable of simulating each set of test behaviors independently.

The invention further provides a machine-readable storage medium for storing a computer program providing a method of test pattern generation for an IC design simulation system, the method comprising merging at least 2 test vectors into a merged vector, wherein each test defines a set of test behaviors, and compiling and linking the merged vector using the IC design simulation system to generate a merged test pattern capable of simulating each set of test behaviors independently.

DESCRIPTION OF THE DRAWINGS

The accompanying drawings, incorporated in and constituting a part of this specification, illustrate embodiments of the invention and, together with the description, serve to explain the features, advantages, and principles of the invention.

FIG. 2A illustrates a format arrangement of test vector according to the invention.

FIG. 2B illustrates a format of a merged vector from test vectors of FIG. 2A.

DETAILED DESCRIPTION

By analyzing format of test vector, duplicate settings in test configuration among test vectors are significant, i.e. duplicate configuration operations are performed when simulating each set of test operation, since, when simulating in design stage, function tests are emphasized such that the configuration of the devices is mostly unchanged.

Even when functions corresponding to settings are being tested, the settings of initial test configuration can remain the same. As described, the IC design simulation system comprises a test model for function simulation of the IC, and a plurality of device models for function simulation of the devices to which the IC is designed to connect. The interactions of the IC and the devices can be simulated to verify the function of the IC. Since duplicate settings in test configuration among test vectors are significant, a method of composing test vectors may provide defining a common configuration for all test vectors, and when different configuration is required, defining configuration modification in the test behavior.

FIG. 2A illustrates a format arrangement of test vector according to the invention. Test vectors 1~M comprise test configurations 11~M1 and test behavior 12~M2, respectively. As shown, a common configuration is composed for all test configurations 11~M1. In this embodiment, test behaviors 12~M2 comprise operations to modify configurations, such as setting register values of test model or device models, to set different configurations for certain operations. For example, if test vector 1 requires configurations other than the common configuration, operations for setting register values of test model or device models are defined in test behavior 12.

FIG. 2B illustrates a format of a merged vector from test vectors of FIG. 2A. Merged vector A0 comprises the common configuration A01 and test behaviors 12~M2, wherein the common configuration A01 is generated by comparing the test configurations 11~M1 for similarity to extract configuration constituents, and test behaviors 12~M2 comprise behavior vectors, each stored sequentially after common configuration as a macro.

Figure 3:
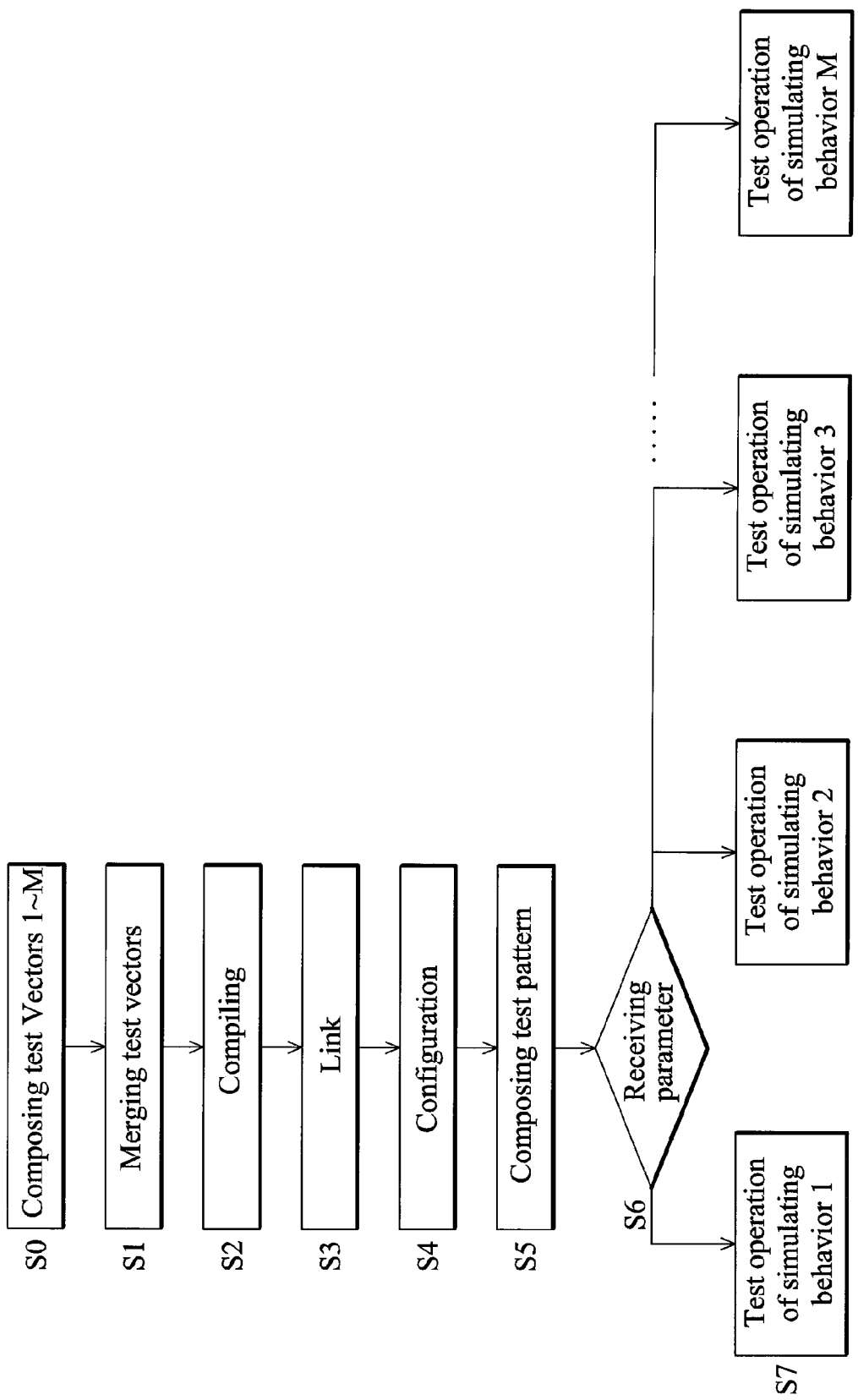
FIG. 3 is a flowchart of generating a merged test pattern by merging test patterns.

FIG. 3 is a flowchart of generating a merged test pattern by merging test patterns. A plurality of test patterns are generated (Step S0) and merged into a merged vector (Step S1), as shown in FIGS. 2A and 2B. The merged vector is the compiled and linked (Step S2 and S3). A configuration function is generated corresponding to the common configuration, and a behavior function is generated corresponding to each behavior vector macro.

The configuration function is executed first to configure the test system (Step S4), and can be saved as a merged test pattern (Step S5). The merged test pattern comprises a test parameter indicating behavior functions to be executed, when executing the merged test pattern (step S6). And than, the specified behavior function(s) can be executed (Step S7).

Figure 1:
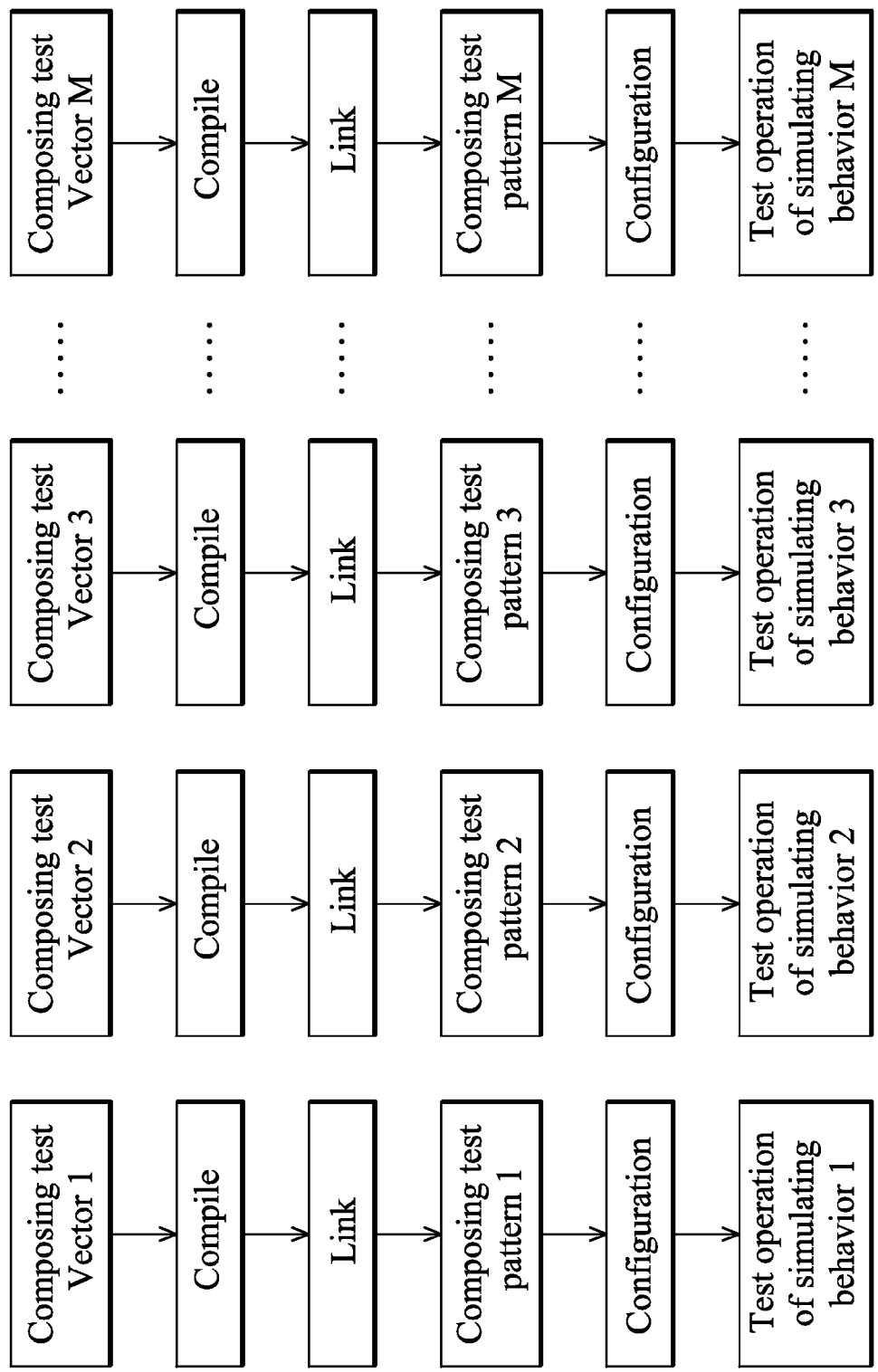
FIG. 1 is a flowchart of a conventional method for an IC design simulation system.

By implementing embodiments of the invention, a plurality of operation set can be defined in a single test vector, and a corresponding test pattern can be generated through one set of compiling, linking and configuration operation. Comparing FIG. 1 to FIG. 3, for execution of the same M sets of test operations, (M-1) times of compiling, linking and configuration operation (and time) are saved.

The method of the invention, or certain aspects or portions thereof, may take the form of program code (i.e., instructions) stored in a machine-readable storage medium, such as floppy diskettes, CD-ROMs, hard disks, or others, wherein when the program code is uploaded to and executed by a machine, such as a computer, the machine becomes an apparatus for practicing the invention.

While the invention has been described by way of example and in terms of preferred embodiment, it is to be understood that the invention is not limited thereto. Those skilled in the technology can still make various alterations and modifications without departing from the scope and spirit of this invention. Therefore, the scope of the present invention shall be defined and protected by the following claims and their equivalents.

What is claimed is:

1. A method of test pattern generation for an integrated circuit (IC) design simulation system, comprising:
    merging at least two test vectors into a merged vector, wherein each test vector defines a set of test behaviors; and
    compiling and linking the merged vector to generate a merged test pattern able to perform each set of test behaviors independently,
    wherein each test vector comprises a test configuration;
    wherein merging the at least two test vectors into a merged vector comprises:
    comparing test configurations for similarity, and extracting configuration constituents comprising all test configurations into a common configuration;
    combining differences between each test vector and the common configuration into a behavior vector; and
    combining the common configuration and all behavior vectors into the merged vector using a predetermined format.

2. The method as claimed in claim 1, wherein the format of the merged vector comprises:
    storing the common configuration in the beginning of the merged vector; and
    storing each behavior vector sequentially after common configuration as a macro.

3. The method as claimed in claim 2, wherein the merged test pattern comprises at least two behavior functions corresponding to the behavior vectors, respectively.

4. The method as claimed in claim 3, wherein the behavior vectors are linked and compiled to the behavior functions respectively by using the IC design simulation system.

5. The method as claimed in claim 3, wherein the merged test pattern operates with a test parameter and executes a behavior function specified by the test parameter.

6. The method as claimed in claim 3, wherein the merged test pattern operates with a test parameter and executes all behavior function.

7. A machine-readable storage medium for storing a computer program providing a method of test pattern generation for an integrated circuit (IC) design simulation system, comprising:
    merging at least two test vectors into a merged vector, wherein each test defines a set of test behaviors; and
    compiling and linking the merged vector using the IC design simulation system to generate a merged test pattern able to perform each set of test behaviors independently,
    wherein each test vector comprises a test configuration;
    wherein merging the at least two test vectors into a merged vector comprises:
    comparing test configurations for similarity, and extracting configuration constituents comprising all test configurations into a common configuration;
    combining differences between each test vector and the common configuration into a behavior vector; and
    combining the common configuration and all behavior vectors into the merged vector using a predetermined format.

8. The machine-readable storage medium as claimed in claim 7, wherein the format of the merged vector comprises:
    storing the common configuration in the beginning of the merged vector; and
    storing each behavior vector sequentially after common configuration as a macro.

9. The machine-readable storage medium as claimed in claim 8, wherein the merged test pattern comprises at least two behavior functions corresponding to the behavior vectors, respectively.

10. The machine-readable storage medium as claimed in claim 9, wherein the behavior vectors are linked and compiled to the behavior functions respectively by using the IC design simulation system.

11. The machine-readable storage medium as claimed in claim 9, wherein the merged test pattern operates with a test parameter and executes a behavior function specified by the test parameter.

12. The machine-readable storage medium as claimed in claim 9, wherein the merged test pattern operates with a test parameter and executes all behavior function.

* * * * *